United States Patent
Rippingale

(10) Patent No.: US 6,771,066 B2
(45) Date of Patent: Aug. 3, 2004

(54) PRINTED CIRCUIT FLUXGATE SENSOR FOR MAGNETIC GRADIENT DETECTION DEVICE

(76) Inventor: John B. Rippingale, 40768 Manor House Rd., Leesburg, VA (US) 20175

( * ) Notice: Subject to any disclaimer, the term of this patent is extended or adjusted under 35 U.S.C. 154(b) by 0 days.

(21) Appl. No.: 10/217,004

(22) Filed: Aug. 12, 2002

(65) Prior Publication Data

US 2004/0027120 A1 Feb. 12, 2004

(51) Int. Cl.[7] ............................................. G01R 33/05
(52) U.S. Cl. ........................ 324/253; 324/249; 33/361
(58) Field of Search ............................... 324/245, 246, 324/249, 253–255, 260; 33/361, 363 R; 340/870.33; 336/200, 221, 229, 232

(56) References Cited

U.S. PATENT DOCUMENTS

| | | | | |
|---|---|---|---|---|
| 3,800,213 A | * | 3/1974 | Rorden | 324/247 |
| 4,088,954 A | * | 5/1978 | Fletcher et al. | 324/249 |
| 4,825,166 A | * | 4/1989 | MacGugan | 324/253 X |
| 4,967,156 A | * | 10/1990 | Seitz | 324/249 |
| 5,199,178 A | * | 4/1993 | Tong et al. | 33/361 |
| 6,121,770 A | * | 9/2000 | Sudo | 324/260 X |
| 6,181,130 B1 | * | 1/2001 | Hoshi et al. | 324/253 |
| 6,270,686 B1 | * | 8/2001 | Tamura | 324/260 X |
| 6,278,272 B1 | * | 8/2001 | Scarzello et al. | 324/253 |

* cited by examiner

*Primary Examiner*—N. Le
*Assistant Examiner*—Darrell Kinder
(74) *Attorney, Agent, or Firm*—Roland H. Shubert

(57) ABSTRACT

A printed circuit fluxgate sensor for use in magnetic gradient detection devices and the like includes a highly magnetically saturable core formed as a flat, closed loop that is bonded between two planar substrate members. An excitation coil is formed on the outer surfaces of the substrate members by masking and etching a layer of a conductive metal in a pattern of tracks that extend across the core. Each track end is connected through a metal plated bore hole through the substrates from one track end to the next adjacent track end on the opposite substrate to form a current path circling the core in a toroidal fashion. Indicia are provided on the sensor that define the mechanical axis and the magnetic axis of the sensor.

17 Claims, 8 Drawing Sheets

PRINTED CIRCUIT FLUXGATE SENSOR FOR MAGNETIC GRADIENT DETECTION DEVICE

BACKGROUND OF THE INVENTION

1. Technical Field

This invention relates generally to a sensor for the measurement of weak magnetic fields.

More specifically, this invention relates to a fluxgate sensor for the detection of small magnetic gradients in the presence of a much larger, static magnetic field.

2. Description of Related Art

One of the most common uses of fluxgate sensors is in magnetic detection devices that locate buried or otherwise hidden pipes and other artifacts by detecting the small magnetic gradients produced by those objects. Traditional fluxgate sensors use thin strips of permalloy, or other saturable ferromagnetic material, that is formed into a toroidal solenoid assembly. The material is driven into magnetic saturation by passing a high amperage alternating current through the solenoid to produce a time varying change in the effective permeability of the space inside the solenoid. That time varying change in permeability causes a time varying change in the static ambient magnetic field near the solenoid. A time varying voltage that is proportional to the static ambient magnetic field can then be produced using a simple pickup coil that would not respond to the static magnetic field alone.

Typical fluxgate sensors, such as for example the Schonstedt scroll sensor that is described in his U.S. Pat. No. 2,916,696, use very thin permalloy tape that is wound on a nonmagnetic base to form the sensor core. An excitation solenoid coil is then wound around that core. The winding of the permalloy core and of the excitation solenoid are hand operations with small associated inaccuracies that cause the sensors to vary in properties, one to the next. In addition, the permalloy tapes used to form the sensor core necessarily have a beginning and an end causing the cores to show asymmetry in at least one axis and a discontinuity that is harder to saturate than is the main core body. Those conditions result in a vector magnetic field measuring device having a magnetic axis that is different from its mechanical axis, with the difference dependent on external factors such as excitation drive level.

Magnetic gradient detection devices ordinarily employ two fluxgate sensors that are spaced apart and accurately aligned one to the other. Sensor misalignment is usually the greatest source of error in gradient detection devices that use conventional fluxgate sensors. The signal output from one sensor is subtracted from the output of the other sensor to cancel that portion of the signal attributable to any uniform magnetic field present at the measuring location but to respond to any difference in field between the two sensors. These devices are used to detect magnetic gradients as small as 10 gammas per foot in the presence of an ambient earth magnetic field ranging from about 25,000 gammas to about 70,000 gammas. A physical misalignment between sensors of arcsin (10 gamma/70,000 gamma), which is less than one one-hundredth of a degree, will cause a change in response of the detection device as it is moved that responds like a 10 gamma gradient.

It is evident that a fluxgate sensor that overcomes the problems inherent in the design of conventional sensors would be a useful and desirable improvement in the art. This fluxgate sensor of this invention achieves those ends.

SUMMARY OF THE INVENTION

The fluxgate sensor of this invention is formed as a laminate that includes a flat, saturable magnetic core of generally oval, elliptical or circular shape bonded between a pair of non-conductive, substrate members. The exterior of each substrate member includes a multi-element metallic track that is shaped to form a toroidal excitation winding about the core by means of multi-point electrical connections through the substrate members. At least one of the substrate members includes indicia defining the magnetic axis and the mechanical axis of the sensor so as to allow precise alignment of one sensor with another.

Hence, it is an object of this invention to provide an improved fluxgate sensor and to provide as well a method for its convenient manufacture.

Another object of this invention is to provide a fluxgate sensor that can be accurately aligned in a spaced apart relationship with another fluxgate sensor.

Other objects of this invention will become apparent from the following description of a preferred embodiment of the invention.

DESCRIPTION OF PREFERRED EMBODIMENTS OF THE INVENTION

Figure 1:
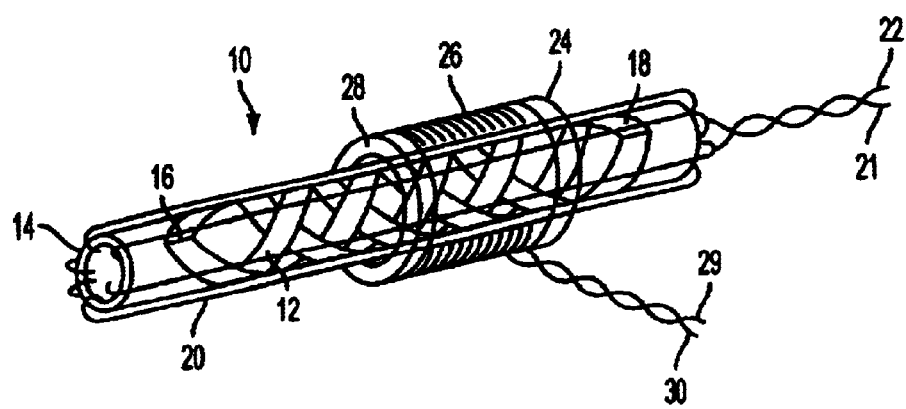
FIG. 1 is a partially cut away view of a prior art sensor of the general type shown in the Schonstedt U.S. Pat. No. 2,916,696.

Referring now to FIG. 1, there is depicted a fluxgate sensor 10 of the general type described by Schonstedt in his U.S. Pat. No. 2,916,696, and the disclosure of that patent is incorporated by reference herein. Sensor 10 employs a double helical coil core 12 that may be formed by winding a highly magnetically permeable metal tape, such as those known in the trade as permalloy, around a non-magnetic tubular support 14. The ends of the tapes making up core 12 are joined at beginning crimp 16 and end crimp 18 to form a magnetically continuous path. Excitation winding 20 loops around the outside of core 12 and through the interior of support 14 in a direction generally parallel to the axis of helical core 12. The winding ends 21, 22 are connected to a source of a.c. electric current. Core 12 is surrounded by a pickup, or signal, coil 24 that includes numerous turns of conductive signal winding wire 26 wound around a cylindrical bobbin 28. Bobbin 28 slips over and around the core 12 and excitation winding 20. Signal winding leads 29, 30 connect to signal processing circuitry (not shown).

Core 12 is driven to saturation by passing a relative high amperage alternating current through excitation winding 20 in order to produce a time varying change in the effective permeability of the space inside winding 20. That time varying change in permeability causes a time varying change in the static magnetic field near the winding which, in turn, permits an a.c. voltage that is proportional to the static magnetic field to be produced in signal coil 24. Coil 24 will not respond to the static magnetic field alone.

Figure 2:
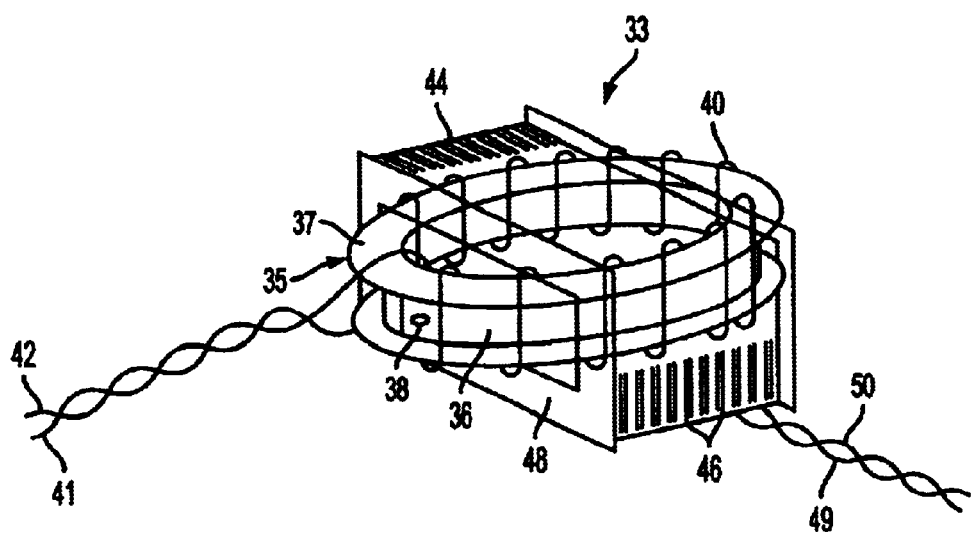
FIG. 2 is a generalized view of another commonly used fluxgate sensor known as a ring-core sensor.

A partially cut away, schematic view of another common prior art fluxgate sensor, known as the Geyger ringcore sensor, is illustrated generally at 33 of FIG. 2. Sensor 33 includes a core 35 that comprises a highly magnetically permeable metal tape 36 mounted around a nonmagnetic support member 37 and joined by welding or other suitable means at tape ends 38. Multiple turns of current carrying wire 40 are wound around core tape 36 and its support member 37 to form a toroidal excitation circuit. The ends 41, 42 of wire coils 40 are connected to a source of alternating current. A pickup, or signal, coil 44 includes numerous turns of conductive wire 46 wound around an annular, nonconductive, rectangular bobbin 48 having a central opening that is sized and shaped to fit around core 35. Signal coil winding leads 49, 50 connect to signal processing circuitry. Operation of the Geyger sensor is like that of the Schonstedt sensor described previously.

In both the Schonstedt and the Geyger sensors the winding of the permalloy metal tape and the winding of the excitation solenoid coils are hand operations with small variations and inaccuracies one unit to the next. That causes the resulting sensors to vary slightly in properties from unit to unit. In addition, the permalloy tape strips used in those sensors necessarily have beginnings and ends causing asymmetry in at least one axis, and a discontinuity that is harder to saturate than is the main body of the core. That results in a vector magnetic field measuring device having a magnetic axis that is different from its mechanical axis with the difference being dependent upon external factors such as excitation drive level.

Figure 3:
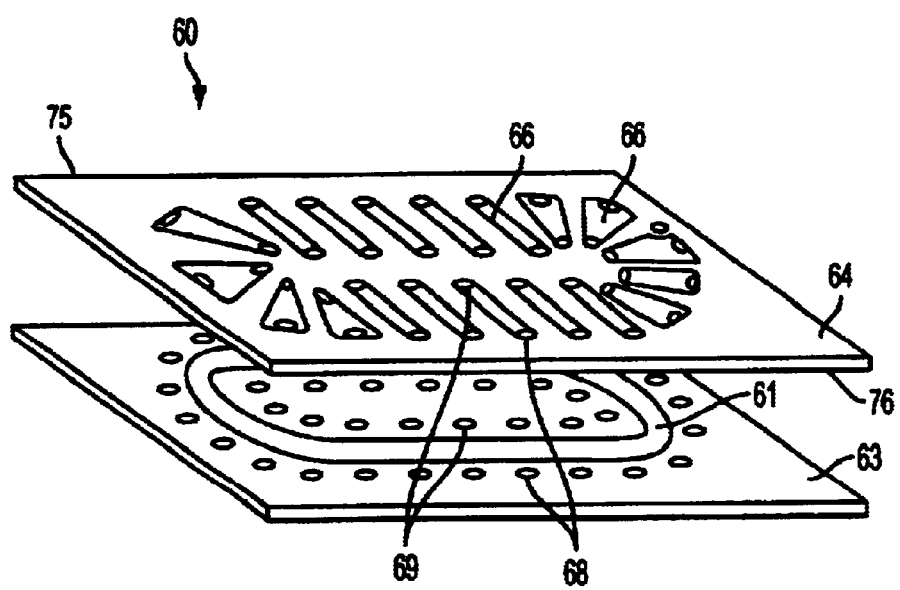
FIG. 3 is an exploded view of the core and excitation coil means of this invention.
Figure 4:
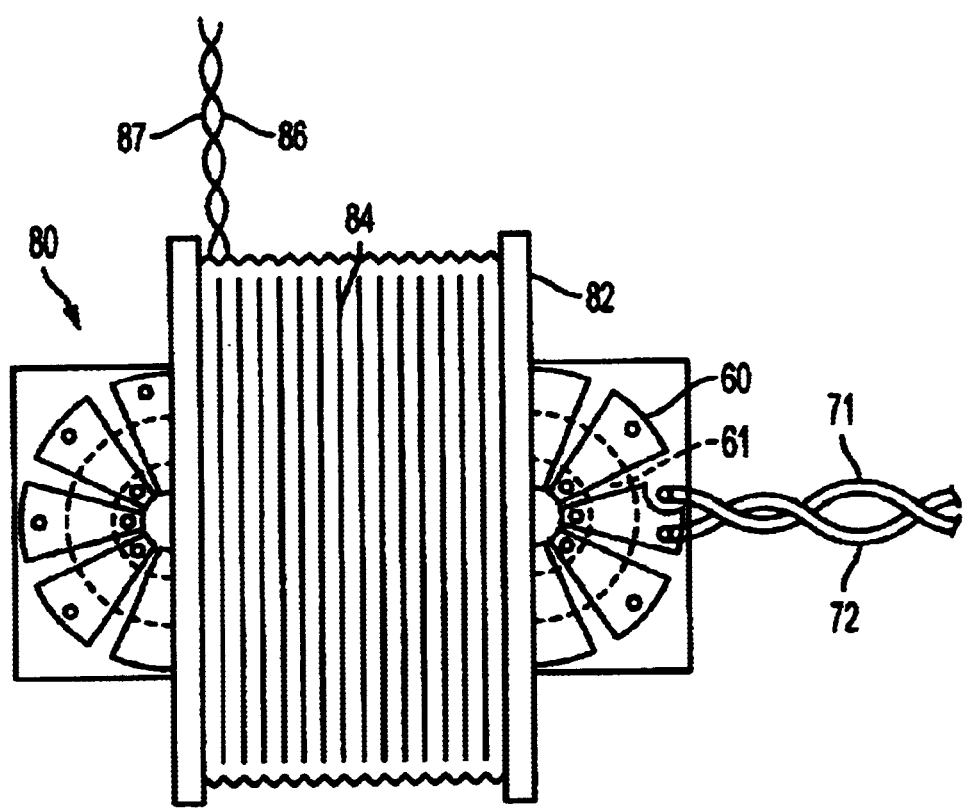
FIG. 4 is a plan view of the fluxgate sensor of this invention as assembled with the signal winding.

The printed circuit fluxgate sensor of this invention, as illustrated in FIGS. 3 and 4, avoids the problems inherent in the prior art sensors and produces a sensor having its magnetic axis and its mechanical axis in precise alignment. Referring first to FIG. 3, there is shown generally at 60 an exploded view of the core and excitation coil means of this invention. Core 61 consists of one or more layers of a highly magnetically permeable tape or foil formed as a closed path or loop and bonded to a bottom planar, nonconductive board or substrate 63 such as those used in the manufacture of printed circuits. After bonding the core 61 to the substrate 63 the resulting laminate is masked to protect the desired shape of the core. It is then etched in the same fashion as is used in the conventional manufacture of printed circuit boards to obtain the shaped core. It is preferred that the core be shaped as an oval, or ellipse, or circle of uniform width and cross-section in order to avoid any core nonuniformity.

A top substrate board 64, similar to substrate board 63, is bonded atop board 63, sandwiching core 61 between the boards. An excitation coil or solenoid for core 61 is formed by masking and then etching a layer of conductive metal, preferably copper, on the outside, or free, surfaces of substrate boards 63 and 64 to form a plurality of conductive tracks 66. Each of tracks 66 extends across core 61 from its outside to its inside, but is electrically insulated from the core by the substrate boards. The track pattern that is etched on the free surface of substrate board 63 is not shown in this view, but is analogous in pattern to that etched on the free surface of substrate board 64. Each track 66 on the free surface of substrate board 64 is electrically connected at its outside and inside ends with the end of its next adjacent counterpart on the free surface of board 64 through mating hole pairs 68,69 passing through the track ends and through the top and bottom substrate boards. A conductive path is created between a track 66 on the free surface of board 64 with its counterpart on the free surface of board 63 by electroplating the interior walls of hole pairs 68, 69 that penetrate through tracks 66 and the substrate boards. The electroplated interiors of the hole pairs form a continuous, and electrically conducting, metal film between the conductive metal tracks on the two substrate surfaces. A current path is thus formed in a pattern equivalent to that obtained using turns of wire circling the core in a toroidal fashion. Electrical leads 71, 72 (FIG. 4) are connected to a power source to energize the excitation solenoid.

The magnetic axis of core 61 is defined by its geometry and by the geometry of the excitation coil that is formed by tracks 66. That geometry can be very precisely defined and controlled in the manufacture of the sensor of this invention and the magnetic axis may therefore be precisely fixed relative to the mechanical axis of the sensor. That circumstance allows indicia to be included that defines the mechanical axis of the sensor relative to its magnetic axis. In a preferred embodiment illustrated in FIGS. 3 and 4, the mechanical axis and the magnetic axis are fixed parallel one to the other, and the indicia defining the orientation of the mechanical and magnetic axes consists of the edges 75, 76 of either the top substrate member 64 or the bottom substrate member 63. Alternatively, appropriate indicia may comprise a line scribed on the surface of one or the other of substrate members 63 or 64, or may comprise two identified points that define a straight line. Such lines need not be parallel to either the mechanical axis or the magnetic axis, but must be in a fixed orientation relative to those axes.

Figure 5:
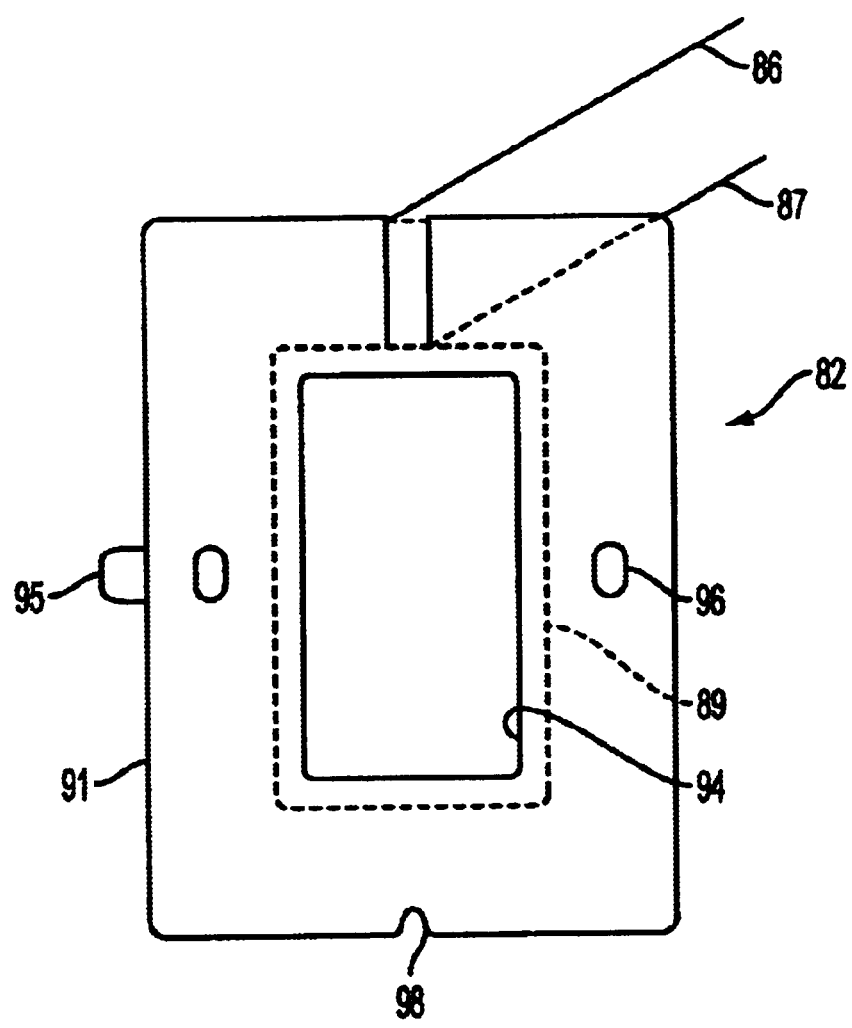
FIG. 5 is an end view of a bobbin means that supports the signal winding.
Figure 6:
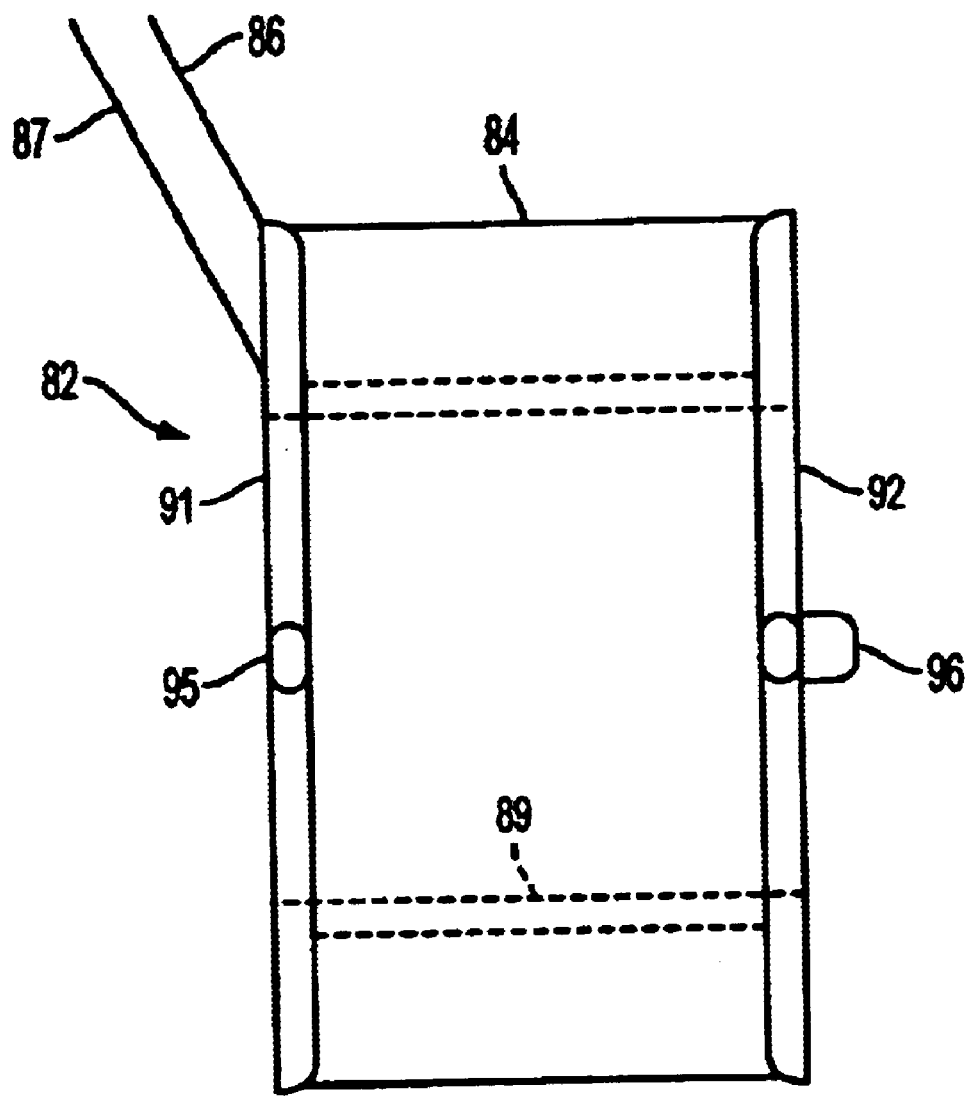
FIG. 6 shows a side view of the bobbin means of FIG. 5.

Referring now to FIGS. 4, 5 and 6, there is shown in FIG. 4 an assembled sensor 80 with the core and excitation coil means 60 in place within a bobbin 82 upon which is wound multiple turns of wire 84 to form a pickup or signal coil. The signal coil may also comprise multiple layers of conductive tracks formed in the same manner as was the excitation coil that was described earlier. The ends of the signal coil wire 86, 87 deliver a signal voltage to processing circuitry. An end view of bobbin 82 is shown in FIG. 5 and a side view of the bobbin is provided as FIG. 6. As is illustrated in those Figures, bobbin 82 includes a central, box-like central element 89 having collars 91, 92 at the ends thereof. Coil wire 84 is wrapped around the exterior of element 89, which preferably is of generally rectangular shape with a centered rectangular opening 94. Opening 94 is sized or arranged to hold the core and excitation coil assembly 60 in a precise orientation relative to the bobbin collars 91, 92. Collars 91, 92 may also be provided with orientation indicia that may, for example, consist of one or more outwardly directed lugs or protrusions 95, 96 at an appropriate location on one or both of the bobbin collars. Instead of a protrusion, that orientation indicia may comprise a notch 98 placed on one or both bobbin collars, or combinations of such structures.

Figure 7:
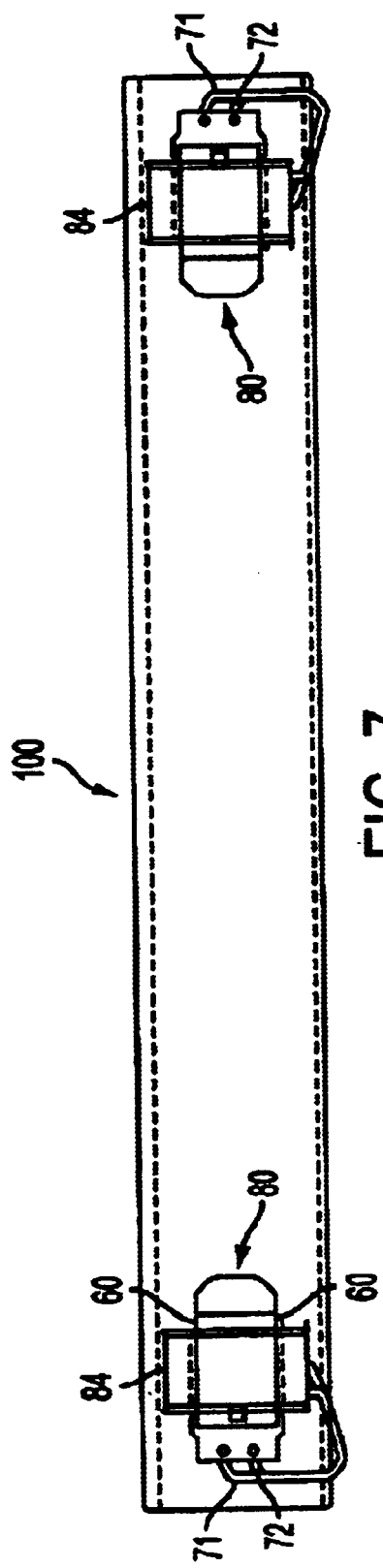
FIG. 7 is a plan view of a magnetic gradient detection device employing the sensors of this invention.
Figure 8:
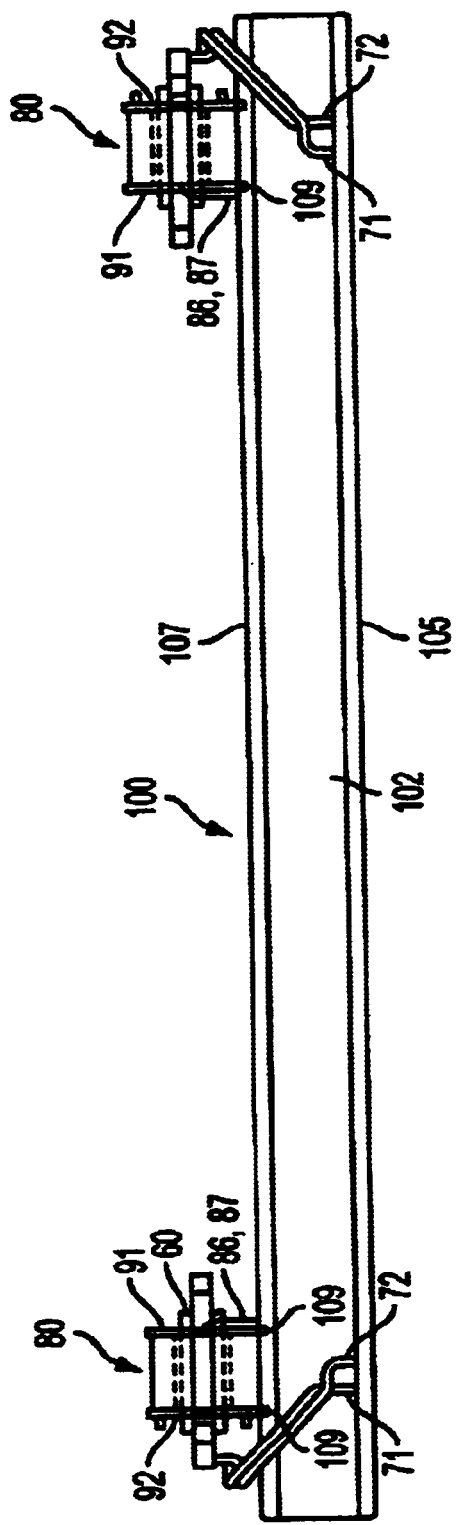
FIG. 8 is a side view of the magnetic gradient detection device of FIG. 7.

A magnetic gradient detection device employing the fluxgate sensors of this invention is shown at 100 in FIGS. 7 and 8. The device employs two sensors 80 that are mounted on a support means in a precisely aligned and spaced apart relationship. The support means preferably comprise a support member 102 having an excitation distribution board 105 fixed on one side thereof, and a printed circuit board 107 fixed on an opposite side. Board 105 serves to provide power to the excitation coil of the sensor by connection through electrical leads 71,72. Circuit board 107 may conveniently serve a dual purpose. The board may first include a preamplifier for an electrical signal produced by the signal coil 84 in response to a change in the magnetic permeability of the excitation coil 60. That signal is transmitted to the board circuitry by way of leads 85, 87 (best seen in FIG. 4.) The board also serves to physically locate and orient the two sensors 80 so that their respective mechanical axes (and their magnetic axes as well) are in precise alignment. Location and alignment of the two sensors on circuit board 107 is accomplished by providing precisely located indents 109 that accept lugs 95 formed on the bobbin collars 91, 92 of the signal coil.

The fluxgate sensors of this invention provide substantial advantages over those of the prior art, particularly when they are employed in magnetic gradient or other detection devices that employ multiple sensors. The sensors themselves are highly sensitive, are very small, and are easy to align as the relationship between the magnetic axis and the mechanical axis is fixed.

While this invention has been described with reference to a preferred embodiment thereof, it will be understood by those skilled in the art that various changes in form and detail may be made without departing from the spirit and scope of the appended claims.

I claim:

1. A fluxgate sensor comprising:
   a first and a second planar, nonconductive substrate member, each member having an inner and an outer side;
   a core consisting of a highly magnetically permeable saturable material formed as a flat, closed loop, said core bonded between the inner sides of said first and second substrate members;
   an excitation coil and core having a magnetic axis and a mechanical axis, said magnetic axis fixed relative to said mechanical axis, said coil comprising a plurality of elongated, electrically conductive tracks placed on the outer sides of said first and second substrate members, each said conductive track extending across said core from inside said core loop to outside said core loop but electrically insulated from the core by said substrate members, first electrically conductive contact means extending from that end of each said elongated track located inside the core loop on the outer side of said first substrate member through said first and second substrate members and connecting with that end of the next adjacent elongated track that is located on the outer side of said second substrate member, second electrically conductive contact means extending from that end of each said elongated track located outside the core loop on the outer side of said first substrate member through said first and second substrate members and connecting with that end of the next adjacent elongated track that is located on the outer side of said second substrate member to thereby form a current path equivalent to that obtained using turns of wire circling said core in a toroidal fashion, and electrical leads to connect said current path to a power source;
   a signal coil that is arranged to produce an electrical signal in response to a change in the magnetic permeability of said excitation coil and core, said signal coil comprising a bobbin having multiple turns of wire wound thereon, the center of said bobbin having an opening sized and shaped to accommodate passage of said substrate members and to hold said core and excitation coil in a precise orientation relative to said bobbin: and
   indicia means defining the mechanical axis of said sensor.

2. A magnetic gradient detection device employing at least two of the sensors of claim 1, said sensors spaced apart with the magnetic axis and mechanical axis of one sensor in precise alignment with the magnetic axis and the mechanical axis of the other sensor.

3. The sensor of claim 1 wherein said first and said second conductive track means comprise holes that pass through the track ends and through the first and second substrate members the interior walls of said holes made electrically conductive by electroplating a metal thereon.

4. The sensor of claim 1 wherein said magnetic axis is parallel to said mechanical axis.

5. The sensor of claim 4 wherein said indicia comprises an edge of one of said substrate members.

6. The sensor of claim 1 wherein said elongated tracks of said excitation coil are formed from a film of an electrically conductive metal that is deposited on the outer side of each of said substrate members.

7. The sensor of claim 6 wherein said metal film is masked to define and protect said elongated tracks and wherein unmasked areas of said film are thereafter etched away.

8. The sensor of claim 7 wherein said metal is copper.

9. The sensor of claim 4 wherein said bobbin includes a generally rectangular box-like element extending between a pair of collars, said box-like element having a centered, rectangular opening therethrough.

10. The sensor of claim 9 wherein at least one side of said collars is provided with orientation indicia that are fixed relative to the mechanical axes of said sensor.

11. The sensor of claim 10 wherein said indicia comprise at least one outwardly directed lug on at least one side of each collar.

12. The sensor of claim 10 wherein said indicia comprise at least one notch on at least one side of each collar.

13. The sensor of claim 1 wherein said core is formed from at least one layer of a tape or foil of said saturable material.

14. The sensor of claim 13 wherein said layer is shaped to form a closed loop having a uniform width and cross-section by masking said layer to define and protect the desired core shape and thereafter etching away unmasked layer areas.

15. The sensor of claim 14 wherein said core is shaped as an oval.

16. The sensor of claim 14 wherein said core is shaped as an ellipse.

17. The sensor of claim 14 wherein said core is shaped as a circle.

* * * * *